US012749649B2

(12) United States Patent
Gahan et al.

(10) Patent No.: US 12,749,649 B2
(45) Date of Patent: Sep. 29, 2026

(54) SHIELDED APPARATUS FOR ION ENERGY ANALYSIS OF PLASMA PROCESSES

(71) Applicant: Applied Materials, Inc., Santa Clara, CA (US)

(72) Inventors: David Gahan, Terenure Dublin (IE); Paul Scullin, Lucan County Dublin (IE)

(73) Assignee: Applied Materials, Inc., Santa Clara, CA (US)

( * ) Notice: Subject to any disclaimer, the term of this patent is extended or adjusted under 35 U.S.C. 154(b) by 283 days.

(21) Appl. No.: 18/515,593

(22) Filed: Nov. 21, 2023

(65) Prior Publication Data

US 2024/0177965 A1 May 30, 2024

(30) Foreign Application Priority Data

Nov. 25, 2022 (EP) .................................... 22209525

(51) Int. Cl.
*H01J 37/244* (2006.01)
*H05K 9/00* (2006.01)

(52) U.S. Cl.
CPC .......... *H01J 37/244* (2013.01); *H05K 9/0052* (2013.01); *H01J 2237/24585* (2013.01)

(58) Field of Classification Search
CPC ........... H01J 37/244; H01J 2237/24585; H01J 2237/32917; H05K 9/0052
See application file for complete search history.

(56) References Cited

U.S. PATENT DOCUMENTS

| | | | | |
|---|---|---|---|---|
| 5,451,784 | A | 9/1995 | Loewenhardt et al. | |
| 7,777,179 | B2 * | 8/2010 | Chen | H01J 49/443 250/397 |
| 8,104,342 | B2 * | 1/2012 | Sun | G03F 7/7085 73/431 |
| 8,816,281 | B2 * | 8/2014 | Funk | H05H 1/0081 250/336.1 |
| 10,083,883 | B2 * | 9/2018 | Tedeschi | H01L 22/14 |
| 2006/0171848 | A1 * | 8/2006 | Roche | H01J 37/32935 422/98 |
| 2008/0032427 | A1 * | 2/2008 | Lee | H01J 37/32412 250/356.1 |
| 2009/0242790 | A1 | 10/2009 | Chen et al. | |

(Continued)

FOREIGN PATENT DOCUMENTS

| | | |
|---|---|---|
| EP | 3968353 A1 | 3/2023 |
| GB | 2547729 A | 8/2017 |

(Continued)

OTHER PUBLICATIONS

Search Opinion and Report, EP Application No. 22209525.9, dated May 19, 2023, pp. 8.

(Continued)

*Primary Examiner* — David E Smith
(74) *Attorney, Agent, or Firm* — Patterson + Sheridan, LLP

(57) ABSTRACT

An apparatus for obtaining ion energy distribution measurements in a plasma processing system comprising a substrate, a plurality of ion energy sensors each having associated control circuitry disposed in the substrate, and a conductive enclosure disposed in the substrate and surrounding each ion energy sensor and associated control circuitry such that the substrate at least partially surrounds the conductive enclosure.

13 Claims, 7 Drawing Sheets

(56) References Cited

U.S. PATENT DOCUMENTS

| | | | | |
|---|---|---|---|---|
| 2011/0174777 | A1 | 7/2011 | Jensen et al. | |
| 2014/0158302 | A1 | 6/2014 | Ikeda et al. | |
| 2017/0247248 | A1 * | 8/2017 | Hoekstra | H04R 1/04 |
| 2022/0076933 | A1 * | 3/2022 | Scullin | H01J 37/32917 |

FOREIGN PATENT DOCUMENTS

| | | | |
|---|---|---|---|
| KR | 2022-0034007 | A | 3/2022 |
| TW | 201937633 | A | 9/2019 |
| WO | 2007130790 | A2 | 11/2007 |

OTHER PUBLICATIONS

Extended European Search Report dated Dec. 2, 2025 for Application No. 25190842.2, 11 pages.

Korean Office Action for Application No. 10-2023-0165893 dated Apr. 30, 2026.

Taiwanese Office Action for Application No. 112144339 dated Jun. 25, 2026.

* cited by examiner

SHIELDED APPARATUS FOR ION ENERGY ANALYSIS OF PLASMA PROCESSES

CROSS-REFERENCE TO RELATED APPLICATIONS

This application claims priority to European Patent Application No. EP22209525, filed Nov. 25, 2022, the entire contents of each are incorporated herein by reference.

FIELD

The present application relates to shielding the components of an imitation wafer probe used for measuring the incident charged particle current densities and energy distributions arriving at a surface of the probe during plasma processing.

BACKGROUND OF THE INVENTION

Plasma processing is used extensively in modern industry for a wide range of applications. A well-known example is the manufacture of integrated circuits in the semiconductor industry. Plasma processing is also used in the production of solar panels, flat panel displays, thin film coatings and medical devices, among many others.

The ion current density (ion flux) and energy distribution (IED) of the ions arriving at a substrate surface strongly influence the performance of plasma based processes. In semiconductor manufacturing the substrate is typically a silicon wafer while in other industries the substrate may be glass panel or a variety of alternatives. Wafer and substrate may be used interchangeably through the document but understood to mean any type of substrate to be used in a plasma process. Throughout the process the substrate surface is bombarded by plasma species, including energetic ions, to remove (etch) and/or deposit layers of material to form structures or features on the workpiece surface. Ion impact may drive the etching and deposition directly, or may be used to activate the surface for more reactive plasma species to do the work. For example, in the plasma etching of features in the semiconductor industry the ion flux and associated IED determines important parameters such as etch rate, etch selectivity and etch anisotropy. The IED is therefore a critical plasma parameter to measure, understand and control to ensure optimum process performance.

As the scale-down of transistor critical dimensions continues, tighter control of the IED at the wafer surface is required. Repeatability and uniformity of the IED is critical for optimal process yield. Wafer and substrate integrated IED probes are therefore essential to the advancement of nanotechnology manufactured using plasma processing.

A variety of probes have been developed over many decades to measure the IED in plasma processes. The planar, retarding field analyser (RFA) design is well known. In many RFA embodiments, a stack of conductive grids, individually separated by insulators, is used to separate ions based on their energy and hence determine the IED. An aperture facing the plasma allows a sample of ions into the probe for analysis. A succession of grids are used to a) prevent plasma penetration inside the device, b) repel plasma electrons, c) discriminate ions based on their energies and d) prevent secondary electron emission from the collector electrode. The collector electrode terminates the stack and is used to detect the ion current signal for measurement. The ion current is recorded for each retarding voltage applied to the ion energy discrimination grid to give an integral form of the energy distribution. The tabulated ion current versus discriminator grid voltage data is numerically differentiated to determine the IED.

Imitation substrates with embedded sensors have been the subject of numerous inventions. Some of these inventions focus on sensor designs and their construction, while others focus on the electronic control platform for processing, storing and transmitting the sensor data. The electronic platform is either fully integrated into the imitation substrate with its own power supply or is decoupled from the imitation substrate using interconnecting wires which pass through the chamber wall, using vacuum feedthroughs, to the electronic control platform located on the air side.

It is known that the electronics within such sensors and associated circuitry in the substrate must be protected from electromagnetic radiation generated by the plasma process. In prior art designs where the electronic control system and power supply is fully integrated into an imitation wafer probe, undesirable electric field formation can also occur and distort the IED measurements. A Faraday shield is usually provided in such prior art sensors to address these issues.

EP 3968353 discloses an apparatus for obtaining ion energy distribution measurements in a plasma processing system comprising, a substrate for placement in the plasma processing system for exposure to the plasma, an ion energy analyser disposed in the substrate for measuring the ion energy distribution at the substrate surface during plasma processing, the analyser comprising a plurality of grids a rechargeable battery power supply including control circuitry, integrated in the substrate, for supplying voltage to each of the grids and the collector of the ion energy analyser. A Faraday shield is provided encasing the ion energy analyser, the power supply and the control circuitry.

US 2011 0174777 teaches embedding sensors and their corresponding power supplying and controlling electronics directly in a diagnostic wafer in order to facilitate the in-situ measurements of plasma properties during plasma operation. This prior art document also teaches protecting said electronics by means of a Faraday shield.

U.S. Pat. No. 8,104,342 provides an instrument for measuring a parameter comprising a substrate, a plurality of sensors carried by and distributed across a surface of the substrate that individually measure the parameter at different positions, an electronic processing component carried by the substrate surface, electrical conductors extending across the surface connected to the sensors and the electronic processing component, and a cover disposed over the sensors, electronic processing component and conductors.

WO 2007/130790 describes a process condition measuring device for measuring a process condition in a processing system that processes workpieces of standard dimensions, comprising a first conductive substrate portion, a second conductive substrate portion, an electrical circuit interposed between the first conductive substrate portion and the second conductive substrate portion, and the first and second conductive substrate portions electrically connected together to form an electrically continuous body that has at least one dimension that is equal to a dimension of a workpiece processed by the processing system.

Some real production wafers are known to develop non-uniform charge build up across the surface. The DC bias potential induced by RF power delivery to the wafer can also be non-uniform across the wafer surface, resulting in non-uniform IED's at different points on the wafer. The formation of an electrically continuous body (to provide a shield) in an imitation wafer probe forces a uniform charge distribution across the surface and forces the DC bias potential to be the same at every point, where the shield becomes an equipotential surface. Therefore, the locally measured IED in the presence of such a shield can be a distorted version of the true IED at that location on a real production wafer.

With such known configurations, RF current is forced to flow around the outside of the continuous shield and not through the wafer. This can also be a problem for some applications.

There are a number of shortcomings with the shielding provided by the prior art imitation substrate probes. There is a need to address these shortcomings.

SUMMARY

The present teachings describe an apparatus or imitation wafer probe for obtaining ion energy distribution measurements in a plasma processing system comprising a substrate, a plurality of ion energy sensors each having associated control circuitry disposed in the substrate, and a conductive enclosure disposed in the substrate and surrounding each ion energy sensor and control circuitry such that the substrate at least partially surrounds the conductive enclosure.

The substrate may be conductive or non-conductive.

The apparatus may further comprise an insulating layer between the substrate and the conductive enclosure.

The substrate may be semi-conducting. Optionally, the substrate is silicon.

The apparatus may further comprise a semi-conducting cover on a surface of the substrate. The semi-conducting cover may be made from silicon.

Optionally, the ion energy sensor measures energy distribution at a first surface of the substrate and the cover is provided at a second surface of the substrate opposite to the first surface.

The apparatus may further comprise an RF antenna disposed in the substrate outside of the conductive enclosure.

Optionally, the RF antenna is connected to the control circuitry.

The RF antenna may be provided at the periphery of the substrate in a non-conductive or semi-conductive region.

Each ion energy sensor and associated control circuitry may be provided on a circuit board.

BRIEF DESCRIPTION OF THE DRAWINGS

The present application will now be described with reference to the accompanying drawings in which:

FIG. 3(*b*) shows another embodiment of the shielded apparatus;

DETAILED DESCRIPTION OF THE DRAWINGS

Figure 1:
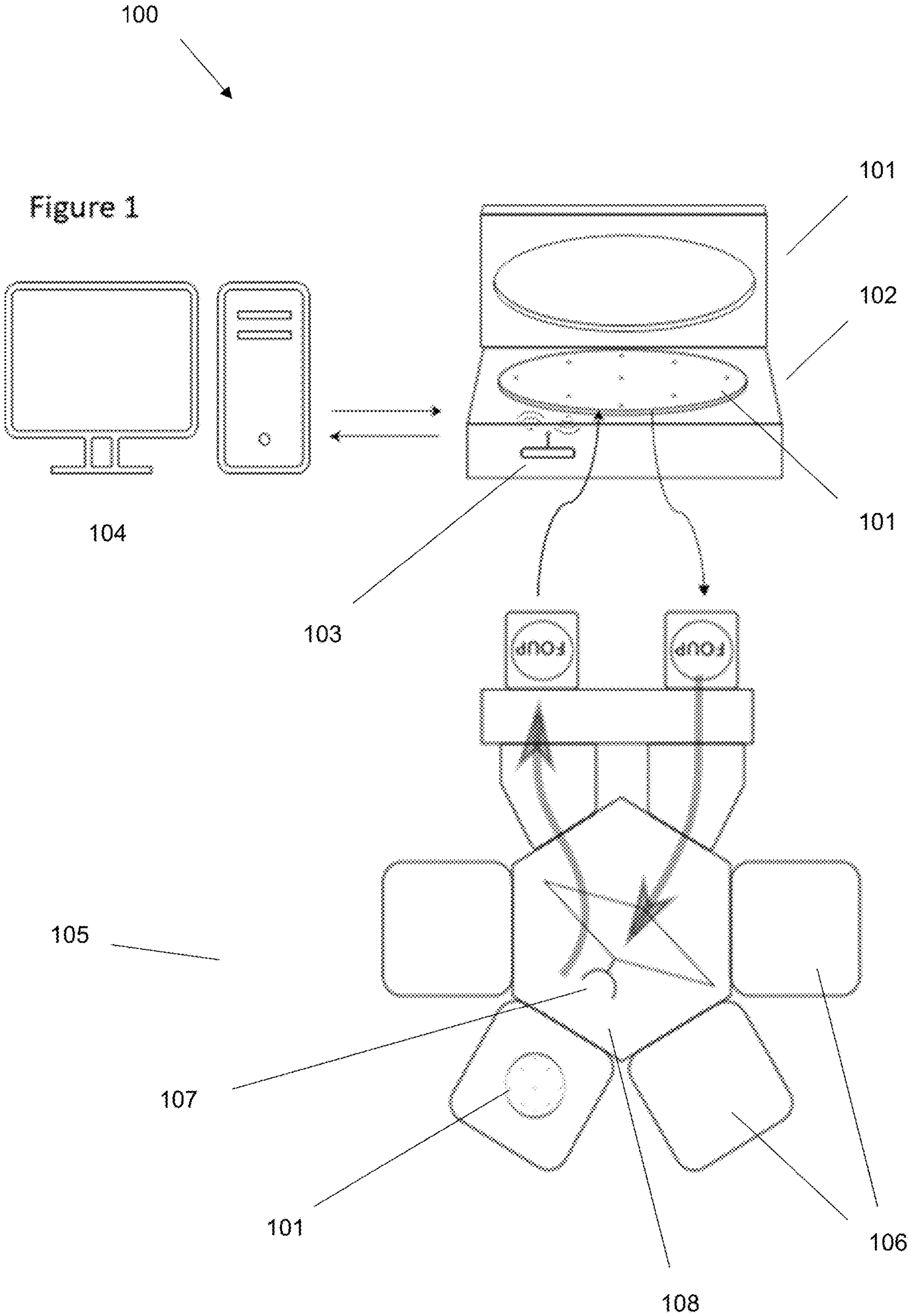
FIG. 1 shows an overview of a system for use with an imitation wafer probe in accordance with the present teachings.

FIG. 1 illustrates an overview of a system 100 that is capable of measuring the ion energy distribution arriving at the surface of an imitation wafer probe 101 surface during plasma processing. In this particular illustration, the diagnostic system 100 includes an imitation wafer probe 101 with integrated ion energy sensors and control electronic circuitry including battery power supply and wireless communication etc. The diagnostic system further comprises a docking station 102 with integrated wireless transponder 103 to enable imitation wafer probe 101 charging, configuration and data retrieval. The docking station 102 is equipped with Ethernet connectivity to communicate with a host PC 104. Application software is provided to display and analyse retrieved data. The application software provides a control panel for scheduling the experimental assignments. An advanced programming interface (API) is also provided to allow direct interaction between the docking station and factory control software.

A four chamber plasma processing system 105 is also shown in FIG. 1. This is one of many different types of plasma processing system and is merely used to illustrate the functionality of the imitation wafer probe 101 in accordance with the present teachings. The plasma processing system 105 may have one or more interconnected processing chambers 106. Each processing chamber 106 is equipped with vacuum pumps to evacuate the chamber, gas flow controls to set the process recipe, vacuum gauges and transducers to regulate process operating pressure, power delivery mechanism to excite the chemical recipe to the plasma state and a pedestal to hold the substrate during processing. A load lock chamber 108 with robotic transfer mechanism 107 is used to transport substrates to and from the processing chambers. Substrate batches are delivered to the load lock chamber 108 through a cassette or FOUP.

The imitation probe 101 is placed in the docking station 102 and communication is established through the application software on the host PC 104. The battery power supply on the wafer probe 101 is charged, stored data retrieved and the next experimental assignment scheduled to prime the wafer probe 101. The imitation wafer probe 101 is then placed in an available slot in a Front Opening Universal Pod (FOUP) which is subsequently delivered to the load lock chamber 108. The robotic arm 107 transports the imitation wafer probe 101 to the processing chamber 106 and positions it on a processing pedestal in preparation for plasma exposure. With the chamber 106 already under vacuum, the process recipe is configured and plasma ignited. When plasma is formed, plasma species begin to bombard the wafer probe 101, a sample of which enters the sensors of the probe 101 for analysis. Analysis proceeds at the times configured in the scheduler if the on-board pressure sensor reports that the threshold for high voltage application has been met. This safety mechanism prevents the accidental application of high voltage at atmospheric pressure, which could destroy the sensor due to electrical arcing. If the pressure threshold has been met, the wafer probe 101 is activated at the scheduled time. The appropriate voltages are applied to all the grids and collector, the collector current is recorded as a function of ion discrimination potential by a microcontroller (MCU), not shown, and the resultant data is stored in memory. The wafer probe 101 returns to sleep mode until the next scheduled measurement, at which point the process is repeated. When the assignment is completed, the plasma process may be terminated to allow retrieval of the wafer probe 101 from the processing pedestal using the robotic arm which transports the wafer probe back through the load lock chamber 108 to the FOUP. The user extracts the wafer probe 101 from the FOUP and places it back in the docking station 102 for data retrieval, recharging and scheduling of the next experimental assignment. Alternatively, it is possible for the wafer probe to transmit the sensor data in real-time to the docking station, from its location inside the processing chamber, using known wireless communication apparatus and methodology.

It should be appreciated that the wafer probe 101 in accordance with the present teachings is not limited for use in the system as shown in FIG. 1 and any suitable system may be chosen.

Figure 2:
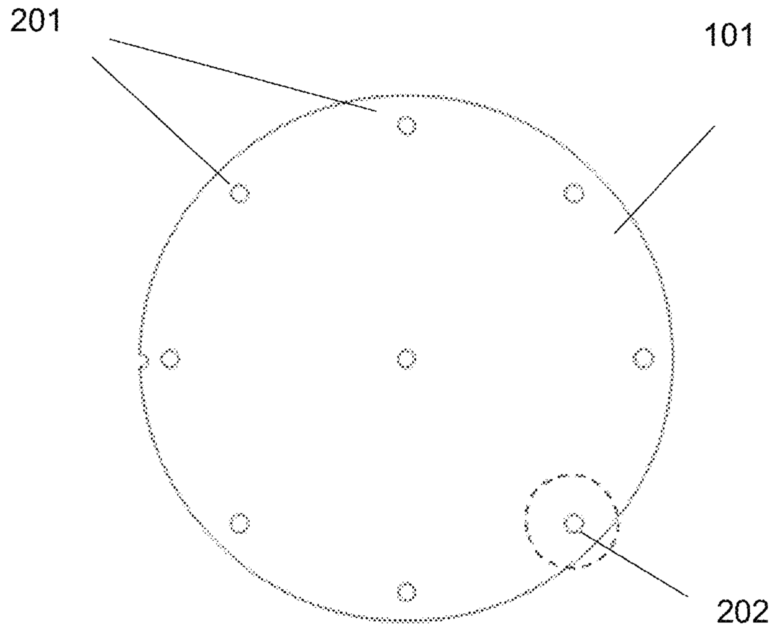
FIG. 2 shows an array of sensors for measuring IED distributed across the surface of an imitation wafer probe.

The configuration of the wafer probe 101 will now be described in more detail. In the preferred embodiment the wafer probe 101 is fabricated on a substrate to mimic the standard semiconductor work piece. It may be manufactured using silicon, ceramic, metal, glass or any other material to mimic the types of substrates used in plasma processing, and may have the same geometry as a standard substrate with substantively the same dimensions and weight. The general configuration of the imitation wafer probe 101 is shown in FIG. 2 which depicts an array of sensors 201 distributed across the surface of a semiconductor wafer probe 101. In particular, FIG. 2 shows a plan view of a wafer probe 101 with nine sensors 201, these sensors 201 are used for measurement of ion energy distribution at the substrate surface of the wafer probe 101. The imitation wafer probe 101 may comprise a single sensor 202 (at any location) or comprise a plurality of spatially distributed sensors 201.

The sensors 201 may comprise alternating layers of planar, parallel, conductive metal grids and insulators, the grids being electrically polarised in a systematic way to filter out plasma electrons, separate positive ions based on their energy, suppress secondary electron emission and collect ion current for measurement. The sensors are embedded in the substrate of the imitation after probe 101. The sensor configuration shown in EP 3968353. However, it should be appreciated that the specific configuration of the sensors 201 used with the imitation wafer probe 101 is not the focus of the present application and any suitable sensor configuration may be used. Rather, the present teachings provide improved techniques for shielding the sensor and associated electronics within the substrate of the imitation probe 101.

Figure 3A:
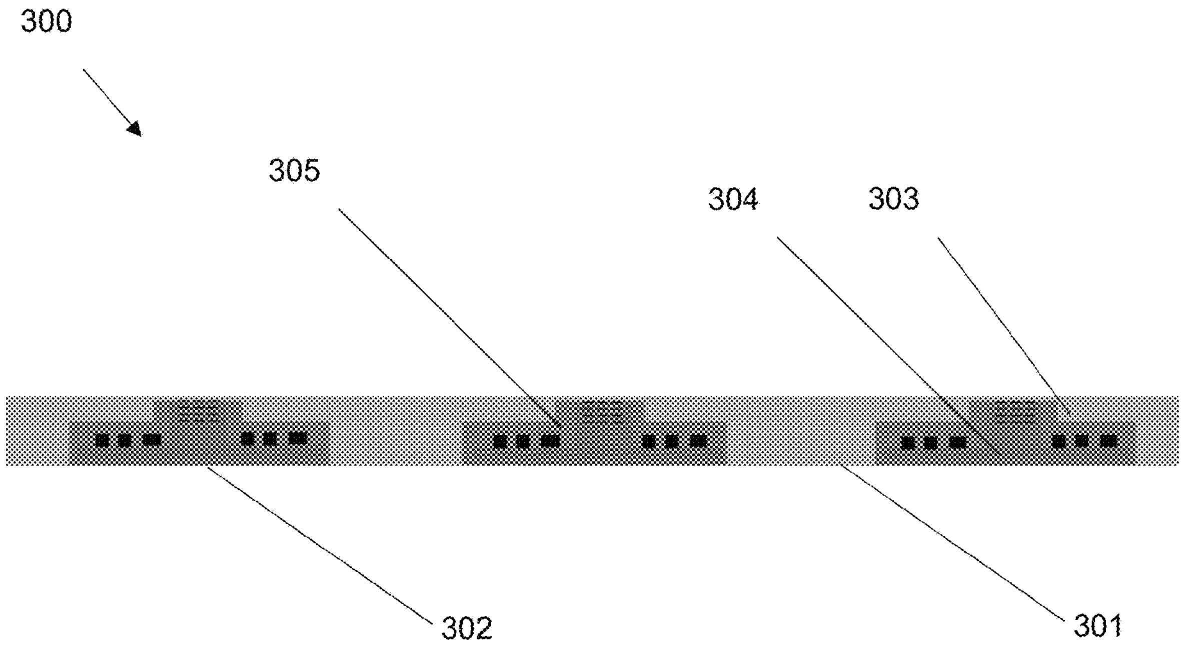
FIG. 3(*a*) shows a first embodiment of a shielded apparatus (imitation wafer probe) in accordance with the present teachings.
Figure 3B:
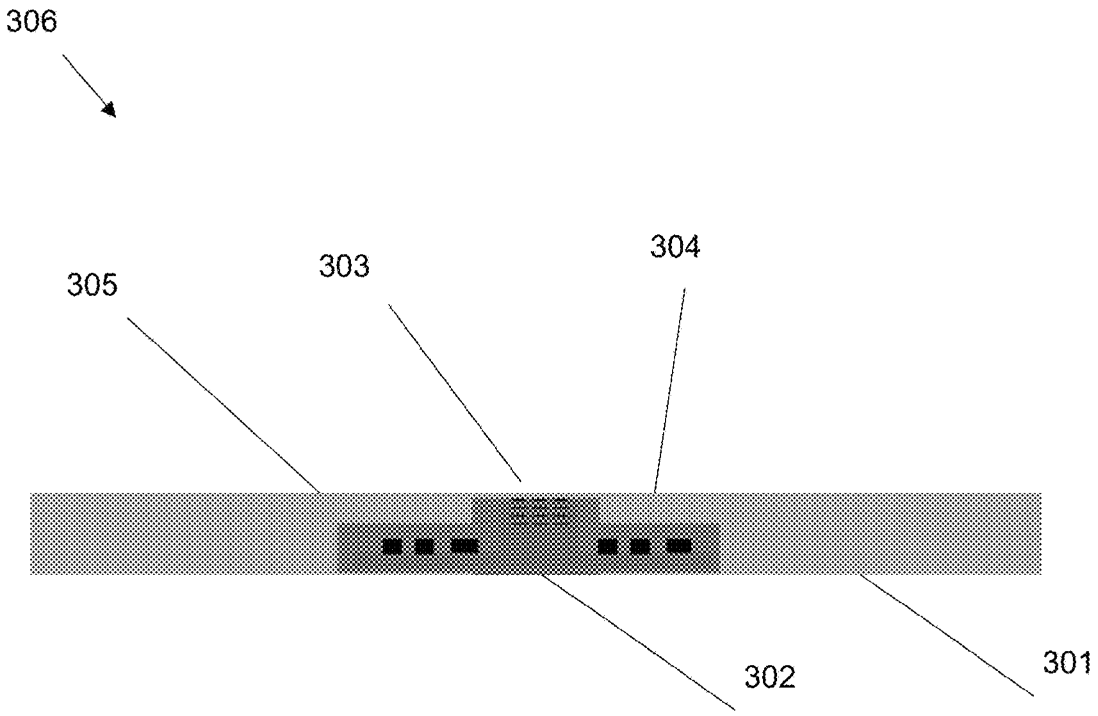

Turning to FIG. 3(*a*), a first embodiment of a shielded apparatus (imitation wafer probe) for obtaining ion energy distribution measurements in a plasma processing system is provided. The apparatus 300 includes a non-conducting substrate 301. A plurality of circuit boards 302 are provided within the apparatus 300 i.e., within the substrate 301. Each circuit board 302 includes a sensor 303 (such as a known grid stack) and associated control circuitry 304. As in known to the person skilled in the art, apertures are manufactured in the plasma facing surface of the substrate 301 and constitute the top surface of the apparatus. In one embodiment the substrate is a 100 mm, 150 mm, 200 mm, 300 mm or 450 mm diameter silicon wafer, but any other material, geometry or dimensions can be used in the manufacture of the wafer probe as required by the application. The control circuitry includes an on board power supply, such as a rechargeable battery, and any other circuitry necessary for operation of the apparatus 300. An antenna may also be provided for charging the battery and communicating with the docking station.

To protect the sensors and associated circuitry, a conductive enclosure 305 is provided surrounding each circuit board 302. It can be seen that the substrate 301 at least partially surrounds each conductive enclosure 305.

In order to measure ion energy and ion flux uniformity, it is important to ensure the distributed sensors 303 are electrically isolated from each other. Therefore, it is advantageous for the sensors 303 to be independently shielded using a conductive enclosure for each sensor 303. This ensures the sensors and associated circuitry are electrically isolated from each other. This in turn allows each sensor 303 to detect exactly what is happening at its respective location without being influenced by an artificially created continuous shield surrounding the device, which may not be representative of the real situation. That is, the absence of an artificially created continuous shield surrounding the device results in more accurate sensor measurements.

In the embodiment of FIG. 3(*a*) the electrically shielded sensors 303 (and associated circuitry) are provided in a non-conducting substrate. This replicates the conditions "seen" by a non-conducting substrate during processing.

Turning to FIG. 3(*b*), this shows the embodiment of FIG. 3(*a*) wherein only a single circuit board 302 with a single sensor 303 is provided in the substrate 301 of the apparatus 306. This variation on the embodiment of FIG. 3(*a*) also ensures the sensor 303 can detect exactly what is happening at its location. Since an artificially created continuous shield surrounding the entire device/apparatus is not provided then this cannot interfere with sensor measurements.

Figure 4:
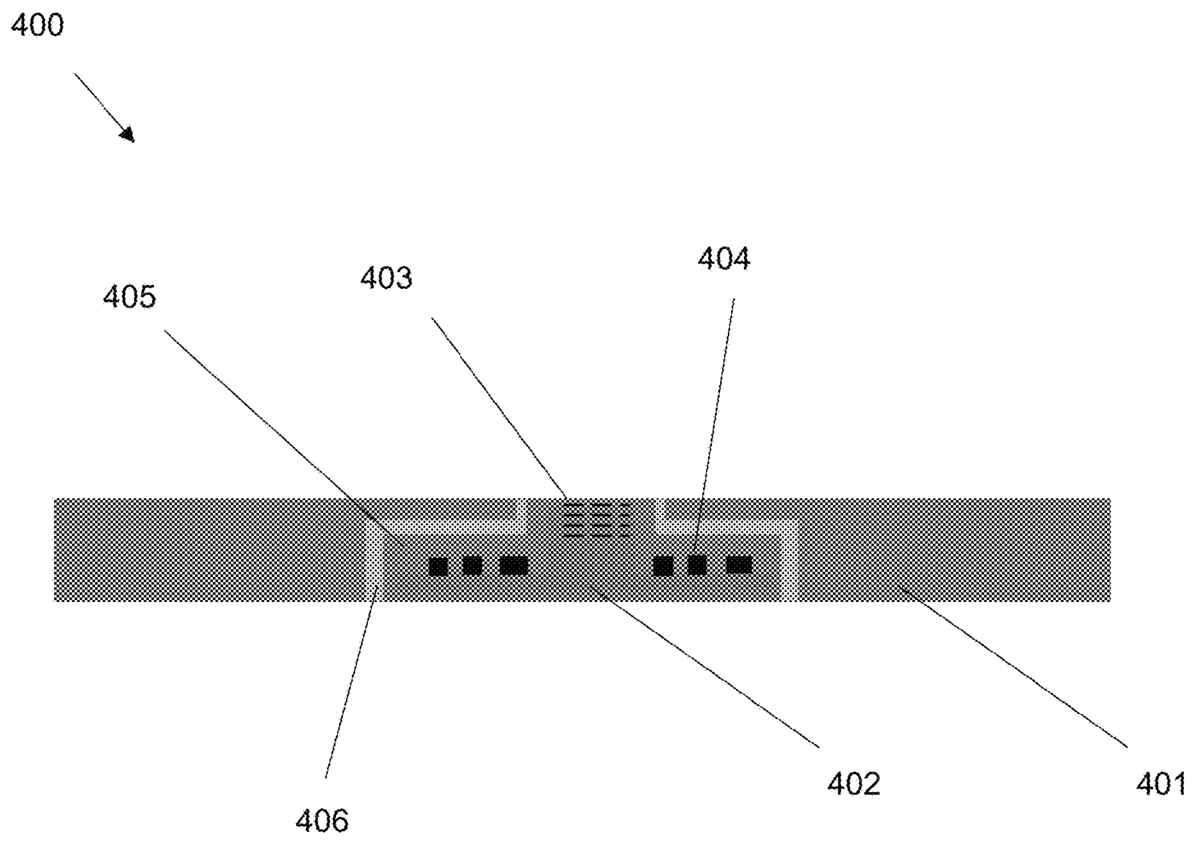
FIG. 4 shows a further embodiment of a shielded apparatus in accordance with the present teachings.

Turning to FIG. 4, this shows another embodiment of a shielded apparatus 400 for obtaining ion energy distribution measurements in accordance with the present teachings. A conductive substrate 401 is provided in which a circuit board 402 having a sensor 403 and associated circuitry 404 is embedded. A conductive enclosure 405 surrounding the sensor 403 and associated circuitry 404 is also shown. In addition, an insulating layer 406 is provided between the conductive enclosure 405 and conductive substrate 401.

In this embodiment, when a conductive substrate 401 is used, it is important to break the naturally formed continuous electrical shield, which could form around the conductive substrate 401. In particular, in the case of a conducting substrate, the rf potential across the surface of the substrate can be non-uniform. To ensure that a true measurement of the plasma conditions at the sensor location is achieved, the conductive enclosure 405 (sensor shield) should be isolated from the conductive substrate 401. This is achieved by installing the insulating layer 406 between the conductive enclosure 405 and the conductive substrate 401 to break the continuity of the conductive enclosure 405 as shown in FIG. 4.

While the embodiment of FIG. 4 is shown with only one circuit board 402 having a sensor 403 and associated circuitry 404 the present embodiment is not limited to this and a plurality of circuit boards may be provided as described with respect to the embodiment of FIG. 3(*a*).

Figure 5:
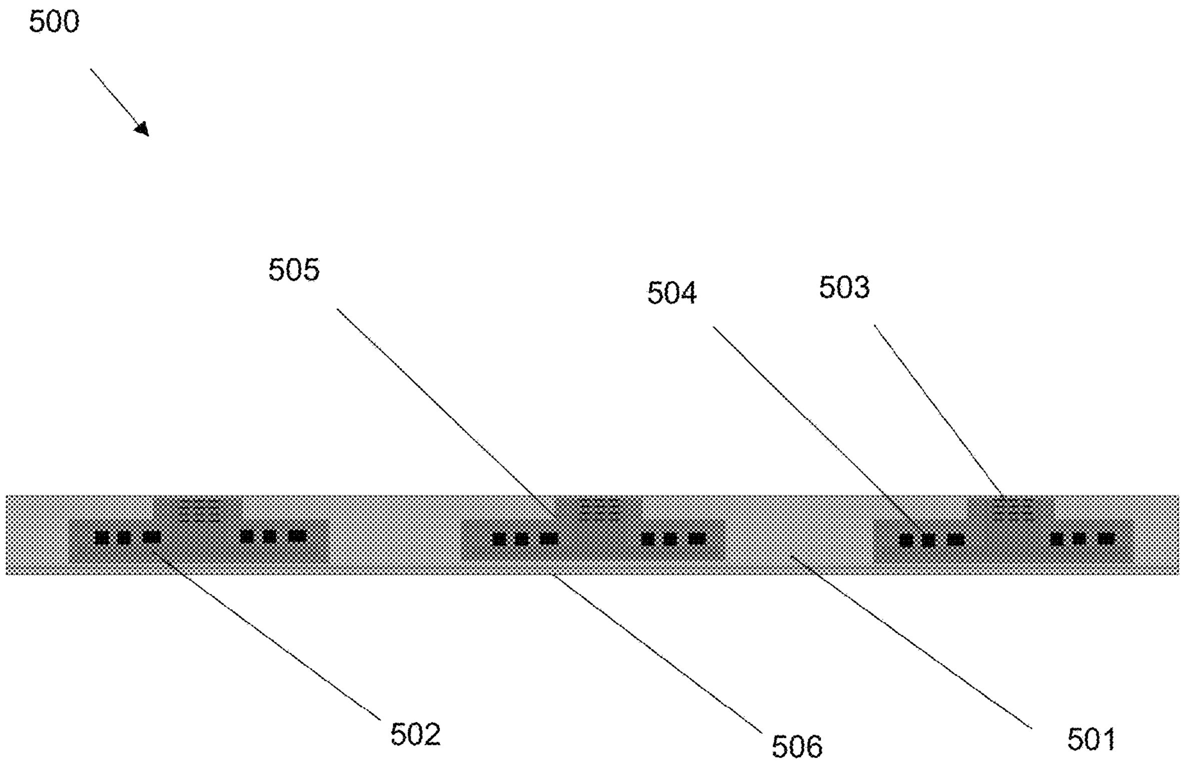
FIG. 5 shows another embodiment of a shielded apparatus.

FIG. 5 shows another embodiment of an apparatus 500 of the present teachings. As previously described, a substrate 501 with circuit boards 502 in the substrate 501 are provided. Sensors 503 and electronic circuitry 504 are provided on the circuit boards 502. A conductive enclosure 505 surrounds each circuit board 502.

The substrate 501 is formed from undoped silicon. As previously mentioned, the substrate 501 of the apparatus 500 in accordance with the present teachings can be manufactured from silicon. For the previously described conductive substrates, these can be formed from doped silicon. However, for silicon based substrates, it is advantageous from a manufacturing point of view to avoid the need to dope the silicon to make it conductive. Silicon is considered a semi-conductor (neither conductor nor insulator). Germanium or another semiconductor material can also be used.

In the undoped silicon substrate embodiment of FIG. 5, a silicon cover 506 is also provided on the bottom side of the substrate 501. That, is the silicon cover 506 is provided on an opposite side of the substrate to which the plasma is detected by the sensors 503. This is useful when the silicon substrate based apparatus 500 is used in a semiconductor production process since the machine will be handling silicon wafers. Therefore, it is desirable to build an imitation wafer probe where all exposed surfaces are made from silicon. This minimises the risk of contamination of the machine by the wafer probe.

A silicon cover or a cover formed from another material may also be used with the other embodiments described herein. That is, a cover may be provided on the underside of any of the apparatuses described herein.

Figure 6:
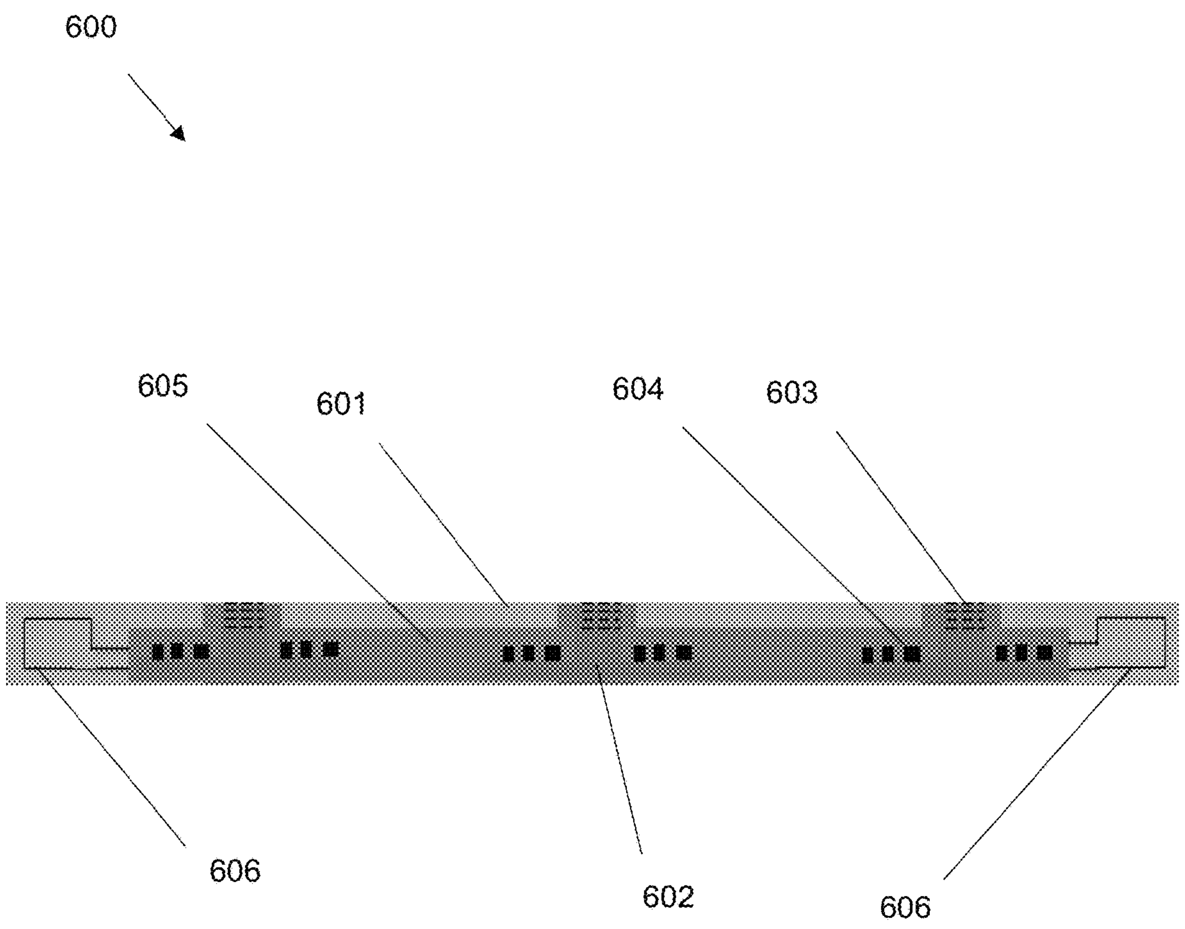
FIG. 6 shows a further embodiment of a shielded apparatus in accordance with the present teachings.

FIG. 6 shows a further embodiment of an apparatus 600 for obtaining ion energy distribution measurements in a plasma processing system. The apparatus comprises a non-conducting substrate 601 and a plurality of circuit boards 602. As previously described, each circuit board 602 includes a sensor 603 and associated control circuitry 604. A single conductive enclosure 605 surrounds the plurality of circuit boards 602 such that none of the substrate 601 is within the conductive enclosure 605.

An RF (loop) antenna 606 is also provided in the non-conducting substrate 601. The antenna is connected back into the control circuitry 604 within the conductive enclosure 605. This antenna 606 is used for communicating data off the apparatus 600 in real-time while the plasma is running, where digitised sensor measurements can be encoded onto the antenna by switching it on and off to modulate the power flow into the chamber at a very low level. This modulation can be sensed on the power feed line.

Although only one rectangular loop antenna 606 is shown in the cross-section view of FIG. 6, a plurality of loop antennas 606 may be provided. 100's of connected loops right around the wafer edge can also be provided. In addition, the loop antennas may be broken into a few sections that can be switched in and out of the apparatus.

While the apparatus if FIG. 6 is shown with multiple circuit boards 602, only a single circuit board may be provided with one or more loop antennas.

For certain applications, it is desirable to centralise all circuitry (and power supplies), while the sensors are distributed at various locations around the wafer. For this embodiment, the conductive enclosure needs to surround the circuitry and all sensing elements in one continuous shield. This would have the configuration of a circular disk in the centre (housing the circuitry) and extending out on spokes to each sensor position. The antenna would circumnavigates the edge of the wafer.

RF antennas (loops) for real time communication cannot be installed in conducting material (conducting substrate) as commonly used in known imitation wafer probes. RF current must be allowed to flow through the wafer cross-section (from bottom to top) to activate the antennas. The RF antenna may also be provided in a semi-conductive region of the substrate.

Figure 7:
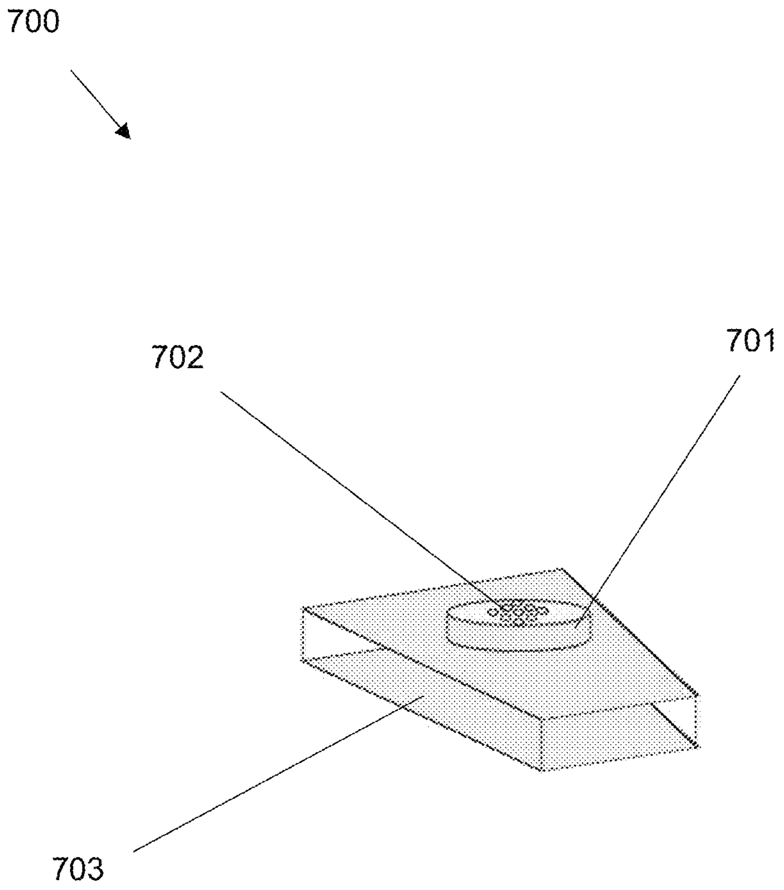
FIG. 7 shows a perspective view of a circuit board for use in a shielded apparatus of the present teachings.

With reference to FIG. 7, this shows a perspective view of the previously described circuit board and associated sensor's conductive enclosure 700, which can be embedded in the substrate of any of the apparatuses described herein. A sensor located inside the raised section 701 with apertures 702 on the top surface thereof is shown. The apertures 702 form an array manufactured in the top surface of the conductive enclosure. The top surface of 702 may be exposed to the plasma and flush with the top surface of the substrate assembly. Alternatively, the top surface of 702 may sit just below a top layer of the substrate, where a matching array of apertures are formed therein, constituting the plasma facing surface of the wafer probe. Plasma species may enter the sensor through 702 for analysis. The sampling apertures 702 can be sub millimetre in diameter and must provide sufficient open area to deliver adequate charged particle flux for detection. The previously described control circuitry or any other components needed for the operation of the imitation wafer probe may be provided in a cavity within section 703 of the circuit board and sensor enclosure 700. The shape and scale of the conductive enclosure 700 depicted in FIG. 7, wherein the sensor stack and circuit are disposed, is for illustrative purposes only. The conductive enclosure 700 may take any suitable form factor.

The invention is not limited to the embodiment(s) described herein but can be amended or modified without departing from the scope of the present invention.

The invention claimed is:

1. An apparatus for obtaining ion energy distribution measurements in a plasma processing system comprising:

a substrate;

a plurality of ion energy sensors each having associated control circuitry disposed in the substrate; and a conductive enclosure disposed in the substrate and surrounding each ion energy sensor and associated control circuitry such that the substrate at least partially surrounds the conductive enclosure, wherein each ion energy sensor and associated control circuitry are disposed within the conductive enclosure.

2. The apparatus of claim 1, where the substrate is non-conductive.

3. The apparatus of claim 1, wherein the substrate is conductive.

4. The apparatus of claim 3, further comprising an insulating layer between the substrate and the conductive enclosure.

5. The apparatus of claim 1, wherein the substrate is semi-conducting.

6. The apparatus of claim 5, wherein the substrate is silicon.

7. The apparatus of claim 5, further comprising a semi-conducting cover on a surface of the substrate.

8. The apparatus of claim 7, wherein the semi-conducting cover is silicon or Germanium.

9. The apparatus of claim 7, wherein the ion energy sensors measure energy distribution at a first surface of the substrate and a cover is provided at a second surface of the substrate opposite to the first surface.

10. The apparatus of claim 2, wherein the RF antenna is disposed in the non-conductive substrate.

11. The apparatus of claim 10, further comprising an RF antenna disposed in the non-conductive substrate outside of the conductive enclosure.

12. The apparatus of claim 11, wherein the RF antenna is connected to the control circuitry.

13. The apparatus of claim 10, where each ion energy sensor and associated control circuitry are provided on a circuit board.

* * * * *